United States Patent [19]
Nakamura

[11] Patent Number: 6,111,786
[45] Date of Patent: Aug. 29, 2000

[54] SEMICONDUCTOR ELECTRICALLY ERASABLE AND PROGRAMMABLE READ ONLY MEMORY DEVICE FOR CONCURRENTLY WRITING DATA BITS INTO MEMORY CELLS SELECTED FROM SECTORS AND METHOD FOR CONTROLLING THE MULTI-WRITE OPERATION

[75] Inventor: Hironori Nakamura, Tokyo, Japan

[73] Assignee: NEC Corporation, Tokyo, Japan

[21] Appl. No.: 09/309,511

[22] Filed: May 11, 1999

[30] Foreign Application Priority Data

May 12, 1998 [JP] Japan ................................. 10-128659

[51] Int. Cl.[7] ................................................. G11C 11/40
[52] U.S. Cl. ............................... 365/185.11; 365/189.01; 365/230.01; 365/230.03; 365/238.5
[58] Field of Search ........................... 365/185.11, 218, 365/230.01, 189.01, 185.01, 185.33, 185.17

[56] References Cited

U.S. PATENT DOCUMENTS

| | | |
|---|---|---|
| 5,608,670 | 3/1997 | Akaogi et al. ...................... 365/185.23 |
| 5,617,357 | 4/1997 | Haddad et al. ..................... 365/185.27 |
| 5,659,505 | 8/1997 | Kobayashi et al. ................ 365/185.29 |
| 5,708,588 | 1/1998 | Haddad et al. ......................... 364/491 |
| 5,790,456 | 8/1998 | Haddad ............................. 365/185.17 |
| 5,805,499 | 9/1998 | Haddad ............................. 365/185.19 |
| 5,818,761 | 10/1998 | Onakado et al. .................. 365/185.18 |
| 5,847,998 | 12/1998 | Van Buskirk ...................... 365/185.33 |
| 5,875,130 | 2/1999 | Haddad et al. .................... 365/185.33 |
| 5,898,621 | 4/1999 | Takahashi et al. ................. 365/185.33 |
| 5,946,232 | 8/1999 | Yoon ................................. 365/185.11 |
| 5,982,665 | 11/1999 | Xing et al. ......................... 365/185.11 |

Primary Examiner—Viet Q. Nguyen
Attorney, Agent, or Firm—Young & Thompson

[57] ABSTRACT

An electrically erasable and programmable read only memory device changes all the memory cells of plural sectors to write-in state through repetition of a multi-write operation before a data erasing, and plural memory cells are concurrently changed to the write-in state through the multi-write-in operation, wherein memory cells for storing a byte of data are concurrently selected from each of the sectors, and electric current flows through the selected memory cell groups and associated source lines into plural switching transistors respectively connected to the source lines so that the plural switching transistors prevent the potential level on the source lines from undesirable floating-up.

19 Claims, 8 Drawing Sheets

SEMICONDUCTOR ELECTRICALLY ERASABLE AND PROGRAMMABLE READ ONLY MEMORY DEVICE FOR CONCURRENTLY WRITING DATA BITS INTO MEMORY CELLS SELECTED FROM SECTORS AND METHOD FOR CONTROLLING THE MULTI-WRITE OPERATION

FIELD OF THE INVENTION

This invention relates to a semiconductor electrically erasable and programmable read only memory device and, more particularly, to a semiconductor electrically erasable and programmable read only memory device such as a flash memory device having memory cells entering into write-in state through a multi-wire.

DESCRIPTION OF THE RELATED ART

A write-in test enhances the reliability of a semiconductor memory device, and is important. In the write-in test, a test pattern is written into the memory cell array, and, thereafter, are read out from the memory cell array. Data bits of logic "0" level or data bits of logic "0" alternated with data bits of logic "1" level form in combination the test pattern. The data write-in to plural memory cells is hereinbelow referred to as "multi-write".

In the write-in test, the test pattern written into the memory cell array is compared with the test pattern read out from the memory cell array to see whether any data bit is different in logic level between the test pattern written into the memory cell array and the test pattern read out therefrom. If a data bit is inverted, the analyst can specify a defective memory cell.

The multi-write is carried out for an electrically erasable programmable read only memory device such as a flash memory device. The memory cells of the flash memory device are implemented by floating gate type field effect transistors. Electron is injected into or evacuated from the floating gates of the memory cells, and the threshold of each floating gate type field effect transistor is variable depending upon the amount of electron accumulated in the floating gate. Two logic levels are corresponding to a high threshold and a low threshold of the memory cell, respectively, and the amount of accumulated electron changes the threshold between the high level and the low level. In the following description, the logic "1" level and the "0" level are assumed to be write-in state and erased state, respectively. Thus, the data bit is stored in the memory cell in the form of threshold, and is rewritable through injection of electron or the evacuation of electron.

In order to rewrite data bits, all the memory cells are to be changed to the erased state, and, thereafter, the memory cells are selectively changed to the write-in state. However, if memory cells in the write-in state are mixed with other memory cells in the erased state, the evacuation of electron results in that the memory cells already in the erased state enter over-erased state. The memory cells in the over-erased state can not change the threshold to the high level after the data write-in. Thus, the over-erased state is undesirable for the flash memory device, and all the memory cells are firstly changed to the write-in state before the data erase.

The data write-in consumes long timer period rather than the data read-out. In fact, the data write-in for each memory cell usually consumes dozens of microseconds. The data storage capacity of the memory cell array is increased, and the data write-in for all the memory cells requires dozens of seconds. For this reason, the multi-write is employed in the flash memory device.

If data bits are concurrently erased from all the memory cells, a large amount of bias power is required, and the bias power source occupies wide area on the semiconductor chip. In order to reduce the bias power consumed in the data erase, the memory cell array is divided into sectors, and plural source lines are connected between a ground line and the sectors. Switching transistors are inserted between the source lines and the ground line, and are selectively changed to the off-state for the sector to be erased. Plural bytes of data are stored in each sector.

In this situation, a bit line selector connects an electric power source to plural bit lines, and the plural bytes are concurrently written into a sector through the multi-write. The multi-write is repeated predetermined times equal to the number of sectors. A flash memory device is assumed to include m sectors each having b bytes per word line. The bit line selector connects the memory cells corresponding to b bytes, i.e., 8b bits, and the electric power source concurrently flows current through the bit line selector to the memory cells corresponding to 8b bits. The flash memory device repeats the multi-write m times. Thus, a large amount of current flows through the bit lines and the memory cells into each of the source lines, and reaches the associated switching transistor.

FIG. 1 illustrates a current path established in the prior art flash memory device during a data write-in for a memory cell. On the other hand, a current path in the multi-write is illustrated in FIG. 2. In FIGS. 1 and 2, a memory cell array 1 includes plural memory sectors 1a, and each memory sector 1a is connected between bit lines B1–Bn and source lines S1–Sm. The memory sector 1a has plural memory cells M11/M12/M13/ . . . /M1n, . . . and Mm1/Mm2/Mm3/ . . . Mmn, and the memory cells M11–Mmn are arranged in rows and columns. Floating gate type field effect transistors serve as the memory cells M11–Mmn, respectively. The bit lines B1–Bn are associated with the columns of memory cells M11–Mmn, and connected to the drain nodes of the memory cells in the associated columns, respectively. On the other hand, word lines W1–Wm are associated with the rows of memory cells M11–Mmn, and are connected to the control gate electrode of the memory cells in the associated rows, respectively. A selected word line W1–Wm and a selected bit line B1–Bn specify one of the memory cells M11–Mmn.

The source lines S1 to Sm are also associated with the rows of memory cells M11–Mmn, and are connected to the source nodes of the memory cells in the associated rows. An n-channel enhancement type switching transistor Qn1 is connected between the source lines S1 to Sm and a ground line GND, and a control signal CTL1 is supplied to the gate electrode of the n-channel enhancement type switching transistor Qn1.

The bit lines B1 to Bn are connected through a selector 2 to a bias voltage source 3. Plural n-channel enhancement type switching transistors Qn11, Qn12, Qn13, . . . and Qn1n to form the selector 2, and are connected between the bit lines B1–Bn and the bias voltage source 3. Selecting lines Sl1, SL2, SL3, . . . and SLn are respectively connected to the gate electrodes of the n-channel enhancement type switching transistors Q11–Qn1n.

An address decoder/word line driver 4 and an address decoder 5 selectively drive the word lines W1–Wm and the selecting line SL1–SLn, respectively. The address decoder/word line driver 4 and the address decoder 5 differently behave in the standard data write-in and the multi-write as follows.

In the standard data write-in, only one memory cell is selected from the sector 1a. When the memory cell M11 is to be changed to the write-in state, the address decoder 5 changes the selecting line SL1 to the active high level H, and keeps the potential level on the other selecting lines SL2, SL3, . . . and SLn in the low level L (see FIG. 1). The n-channel enhancement type switching transistor Qn11 turns on, and the bias voltage source 3 supplies 5 volts through the n-channel enhancement type switching transistor Qn11 and the bit line B1 top the drain node of the memory cell M11. The address decoder/word line driver 4 changes the word line W1 to 10–12 volts, and keeps the other word lines Wm in zero. The control gate of the memory cell M11 is biased to 10–12 volts. The control signal CTL1 is supplied to the gate electrode of the n-channel enhancement type switching transistor Qn1, and the n-channel enhancement type switching transistor Qn1 turns on. Then, the source line S1 is connected through the n-channel enhancement type switching transistor Qn1 to the ground line GND, and ground level or zero volt is supplied to the source node of the memory cell M11.

Although the zero volt and 10–12 volts are respectively supplied to the source nodes of the memory cells M12, M13, . . . and M1n and the control gates of the memory cells M12–M1n, the selector 2 blocks the drain nodes of the memory cells M12–M1n from the bias voltage source 3, and hot electron is generated in the memory cell M11, only. The hot electron is injected from the drain node to the floating gate, and the memory cell M11 enters the write-in state. Thus, the electric current flows through the memory cell M11 into the n-channel enhancement type switching transistor Qn1, and only a small amount of current is consumed.

On the other hand, when the multi-write is requested, the prior art flash memory device instructs the address decoder 5 to change all the selecting lines SL1, SL2, SL3, . . . and SLn to the active high level H (see FIG. 2). All the n-channel enhancement type switching transistors Qn11, Qn12, Qn13, . . . and Qn1n turn on, and the bias voltage source 3 is connected through the n-channel enhancement type switching transistors Qn11–Qn1n to all the bit lines B1, B2, B3, . . . and Bn. The control signal CTL1 makes the n-channel enhancement type switching transistor Qn1 turn on, and the address decoder/word line driver 4 changes the word line W1 to 10–12 volts. The hot electrons are generated in memory cells M11, M12, M13, . . . and M1n, and are concurrently injected to the floating gates of those memory cells M11–M1n.

Thus, a large amount of electric current flows through the memory cells M11–M1n into the n-channel enhancement type switching transistor Qn1. Each word line W1/Wm is usually connected to eight to sixty-four memory cells, and the electric current in the multi-write is eight sixty-four times more than that in the standard data write-in. Such a large amount of electric current floats the potential level on the source lines S1–Sm, and decreases the potential difference between the bit lines B1–Bn and the source line S1. This results in reduction of the injection efficiency. The amount of electron accumulated in the floating gate is so short that the memory cells M11–M1n can not change the threshold to the high level. Otherwise, the injection is to be continued for a long time, and the multi-write consumes a long time.

If the n-channel enhancement type switching transistor Qn1 is scaled up, the n-channel enhancement type switching transistor Qn1 has a large current driving capability, and does not float the potential level on the source lines S1–Sm. However, the plural sectors 1a respectively require the n-channel enhancement type switching transistors Qn1, and the large-sized n-channel enhancement type switching transistors Qn1 consume wide occupation area on the semiconductor chip. This means that the manufacture needs to enlarge the semiconductor chip.

SUMMARY OF THE INVENTION

It is therefore an important object of the present invention to provide a semiconductor electrically erasable and programmable read only memory device, which achieves a high injection efficiency in a multi-write without large-sized discharging element.

It is also an important object of the present invention to provide a method for controlling the multi-write.

To accomplish the object, the present invention proposes to select memory cells from plural sectors in a multi-write operation. Electric current flows through the selected transistors and switching elements respectively associated with the plural sectors into a discharging line. Each switching element is only expected to discharge a small amount of current, and does not float the potential level on the associated source line.

In accordance with one aspect of the present invention, there is provided a semiconductor non-volatile memory device comprising a memory cell array divided into plural sectors each having plural addressable memory cells respectively storing data bits in the form of accumulated carrier changing the plural memory cells between different threshold levels, a data write-in circuit for producing a write-in potential used for increasing the accumulated carrier, a first addressing circuit selecting sectors from the memory cell array in a multi-write operation for propagating the write-in potential to the sectors, a second addressing circuit selecting at least one memory cell from each of the sectors selected by the first addressing circuit for propagating the write-in potential to the memory cells selected from the sectors, source line controllers respectively associated with the plural sectors and having respective switching elements connected between the plural addressable memory cells of the associated plural sectors and a discharging line, and a controlling circuit causing the switching elements associated with the sectors selected by the first addressing circuit to turn on in the multi-write operation for discharging electric current due to the write-in potential through the memory cells to the discharging line.

In accordance with another aspect of the present invention, there is provided a method for controlling a multi-write operation comprising the steps of a) selecting memory cells from sectors, which are selected from a memory cell array, b) creating current paths from a source of write-in potential through the memory cells and switching transistors respectively connected to the sectors to a discharging line, and c) applying a write-in potential through the current paths to the memory cells so that the memory cells change respective thresholds due to carriers injected thereinto.

BRIEF DESCRIPTION OF THE DRAWINGS

The features and advantages of the semiconductor electrically erasable and programmable read only memory device and the controlling method will be more clearly understood from the following description taken in conjunction with the accompanying drawings in which.

CONCEPT OF THE PRESENT INVENTION

Figure 1:
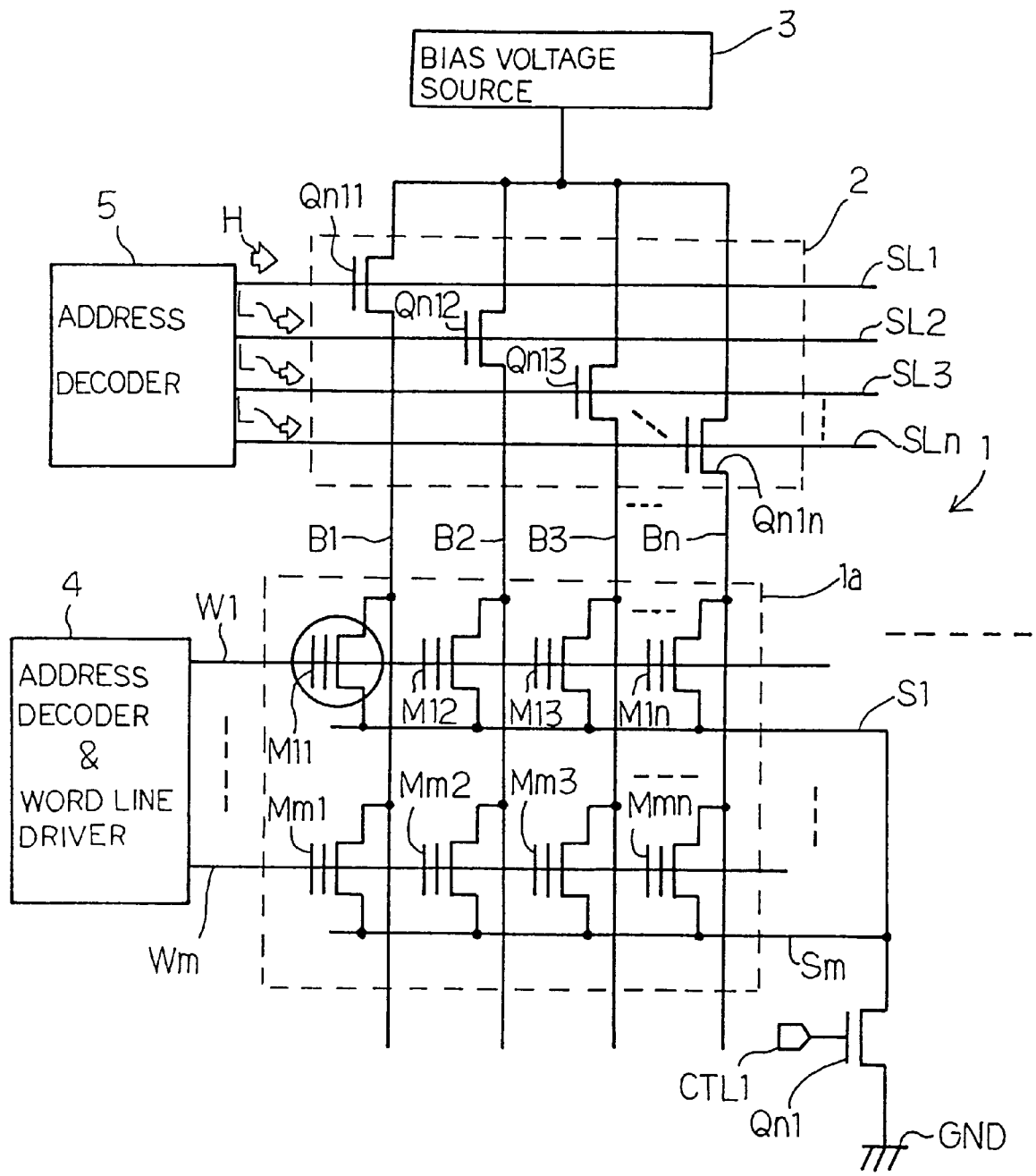
FIG. 1 is a circuit diagram showing the current path in the data write-in carried out in the prior art flash memory device.
Figure 2:
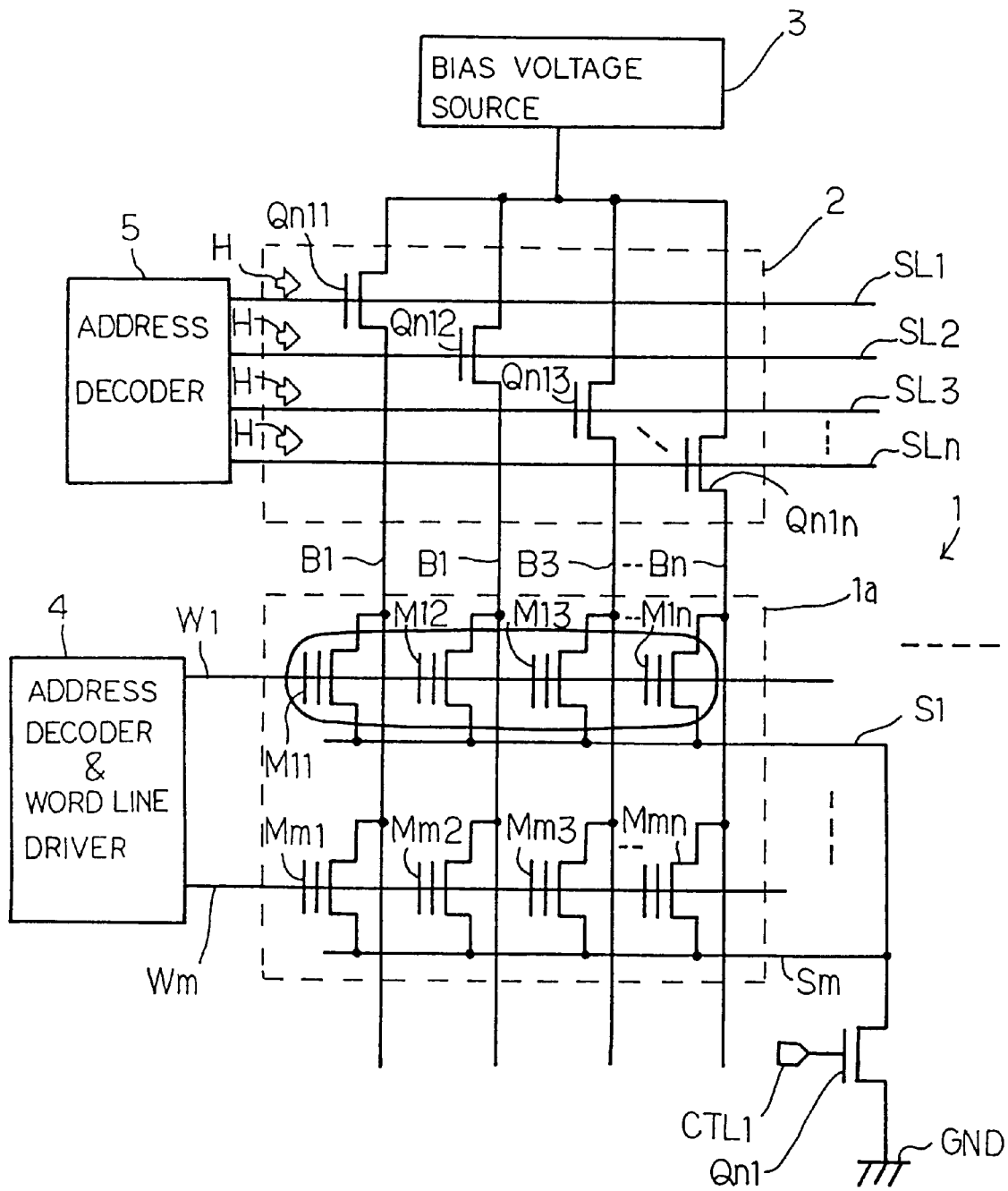
FIG. 2 is a circuit diagram showing the current path in the multi-write carried out in the prior art flash memory device.
Figure 3:
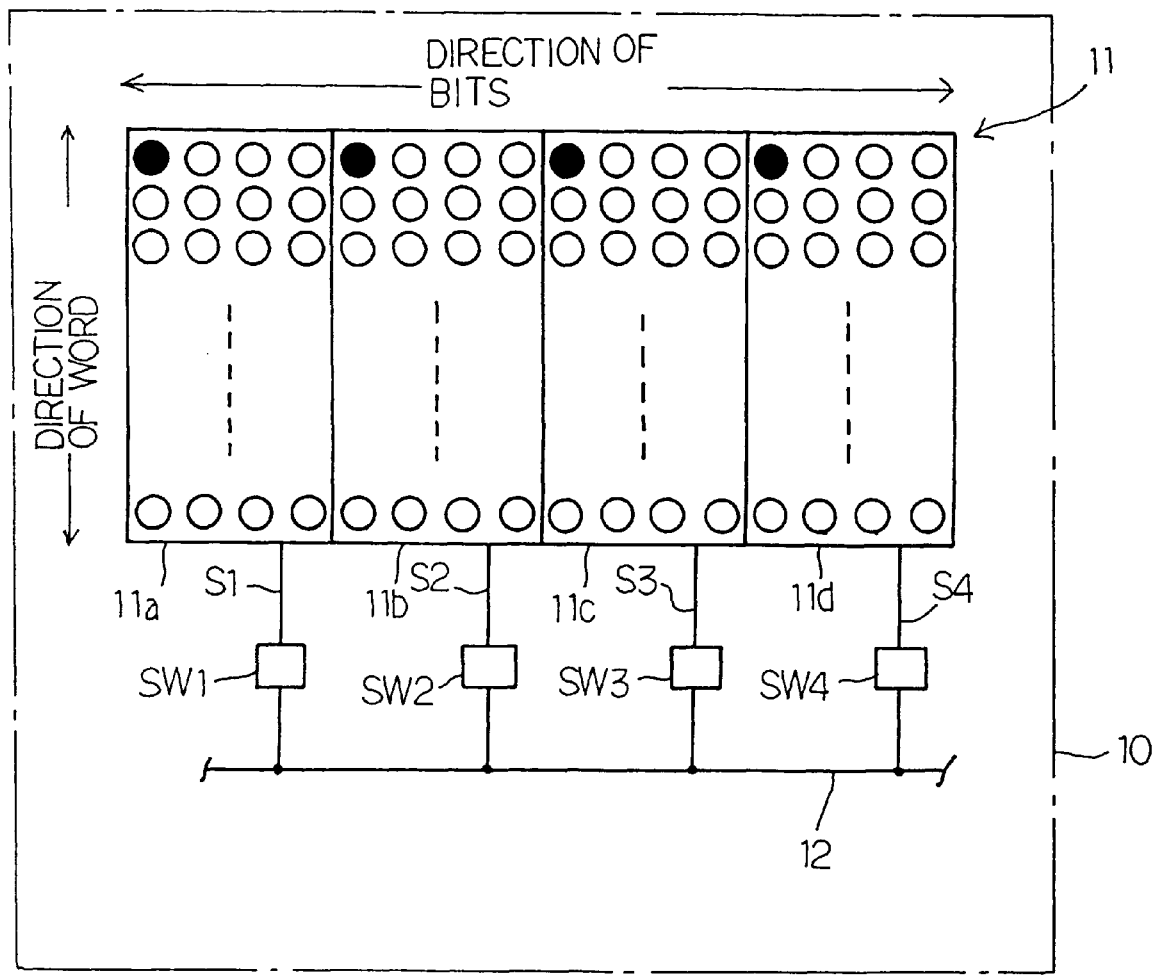
FIG. 3 is a view showing the concept of the present invention.

FIG. 3 illustrates the concept of the present invention. Reference numeral 10 designates a semiconductor chip where an electrically erasable and programmable read only memory device such as, for example, a flash memory device is fabricated. In the following description, term "byte" means a plurality of data bits concurrently read out from or written into plural memory cells. A memory cell array 11 is divided into four sectors 11a/11b/11c/11d, and the four sectors 11a/11b/11c/11d are respectively connected to source lines S1/S2/S3/S4. Switching elements SW1/SW2/SW3/SW4 are respectively associated with the sectors 11a/11b/11c/11d, and are connected between the source lines S1/S2/S3/S4 and a constant potential line 12.

A group of memory cells assigned a byte is represented by a black circle or a white circle, and is hereinbelow referred to as "memory cell group". Plural memory cell groups are incorporated in each of the sectors 11a/11b/11c/11d. In this instance, each sector 11a/11b/11c/11d has a four byte structure, and four memory cell groups are connected to each word line (not shown).

When the multi-write is requested, four memory cell groups, which are represented by the black circles, are selected from the four sectors 11a/11b/11c/11d, respectively, and all the switching elements SW1/SW2/SW3/SW4 concurrently turn on. Electric current is branched into four sub-currents, and the four sub-currents flow through the selected memory cell groups and the source lines S1/S2/S3/S4 to the switching elements SW1/SW2/SW3/SW4, respectively. If the prior art flash memory device has a memory cell array arranged similarly to the memory cell array 11, the four memory cell groups are selected from one of the sectors, and all the electric current flows into one of the switching elements SW1/SW2/SW3/SW4. Thus, amount of sub-current is a quarter of the electric current flowing into the switching element of the prior art flash memory device, and the sub-currents do not float the potential level on the source lines S1/S2/S3/S4.

Four memory cell groups are sequentially selected from the four sectors 11a/11b/11c/11d, and the multi-write is repeated for the four memory cell groups. Finally, all the memory cell groups enter the write-in state.

DESCRIPTION OF THE PREFERRED EMBODIMENTS

First Embodiment

Figure 4:
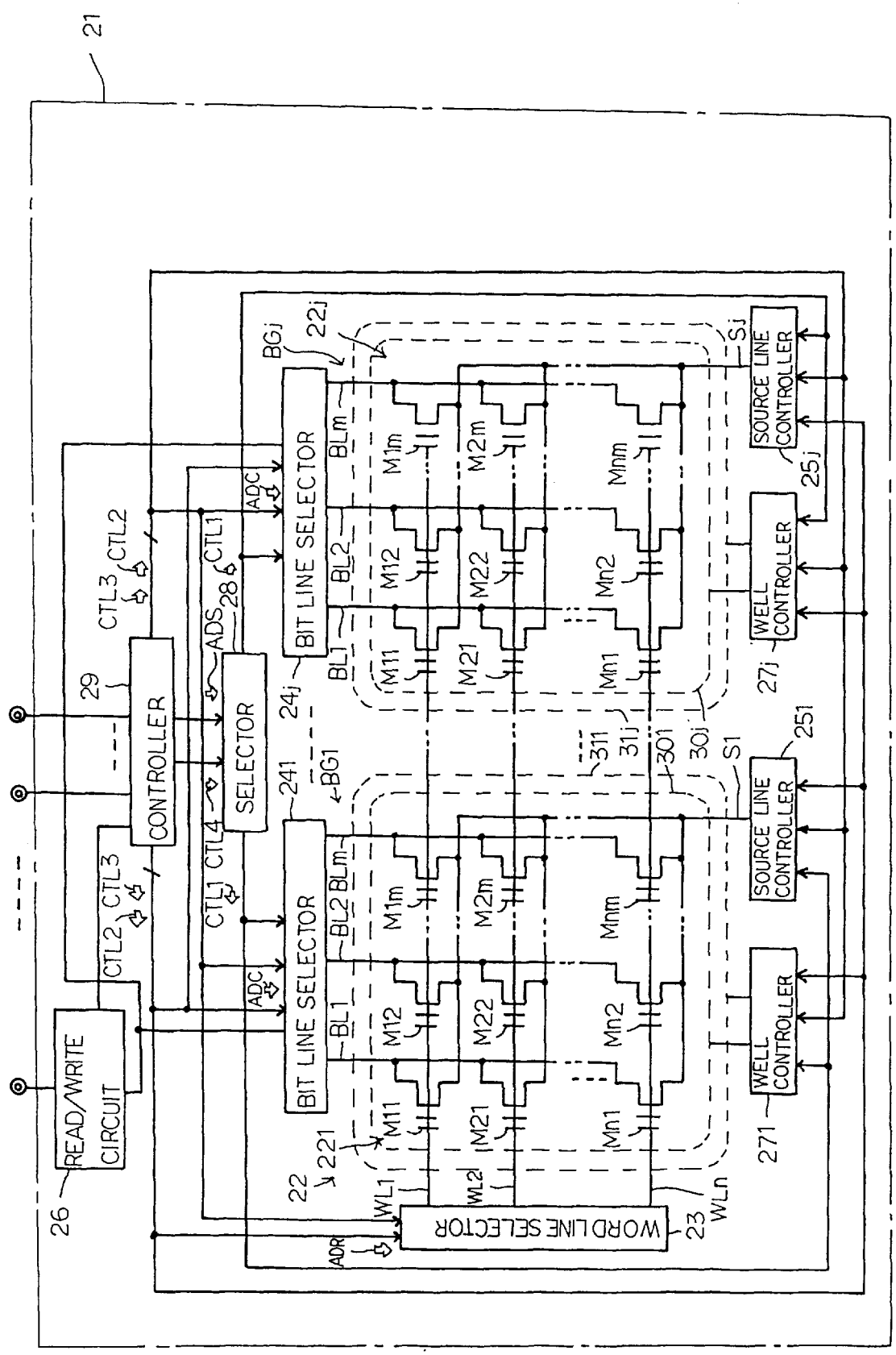
FIG. 4 is a block diagram showing the arrangement of a semiconductor electrically erasable and programmable read only memory device according to the present invention.

Turning to FIG. 4 of the drawings, an electrically erasable and programmable read only memory device embodying the present invention is fabricated on a semiconductor chip 21. The electrically erasable and programmable read only memory device is categorized as a flash memory device. The electrically erasable and programmable read only memory device has at least a write-in mode, a read-out mode, an erasing mode and a multi-write mode, and selectively enters these modes of operation.

The electrically erasable and programmable read only memory device comprises a memory cell array 22. The memory cell array 22 is broken down into plural sectors 221 to 22j, and each sector 221/.../22j includes plural memory cells M11, M12, M1m/M21, M22, ... M2m/ ... Mn1, Mn2, ... Mnm. The plural memory cells M11–Mnm are arranged in rows and columns. Each of the memory cells M11–Mnm is implemented by a floating gate type field effect transistor. The floating gate type field effect transistor changes the threshold thereof between a high level and a low level depending upon the amount of electron accumulated in the floating gate electrode.

The electrically erasable and programmable read only memory device further comprises plural word lines WL1, WL2, ... WLn, plural bit line groups BG1–BGj and plural source lines S1–Sj. The word lines WL1–WLn are shared between the sectors 221–22j, and are respectively associated with the rows of memory cells of each sector 221–22j. The word lines WL1–WLn are connected to the control gates of the associated floating gate type field effect transistors. Plural bit lines BL1, BL2, ... BLm form each of the plural bit line groups BG1–BGj, and are associated with the columns of memory cells M11–Mnm of the associated sector 221–22j. The bit lines BL1–BLm are connected to the drain nodes of the associated memory cells M11–Mnm. The source lines S1–Sj are respectively associated with the sectors 221–22j, and are connected to the source nodes of the memory cells M11–Mnm in the associated sectors 221–22j.

The electrically erasable and programmable read only memory device further comprises a word line selector 23, plural bit line selectors 241–24j respectively associated with the sectors 221–22j, plural source line controller 251–25j also associated with the sectors 221–22j, respectively, a read/write circuit 26, plural well controllers 271–27j also associated with the sectors 221–22j, respectively, a selector 28 for selecting one of or all of the plural sectors 221–22j and a controller 29. The plural bit line selectors 241–24j, the plural source line controllers 251–25j and the plural well controllers 271–27j are under the control of the selector 28, and the controller 29 instructs the word line selector 23, the bit line selectors 241–24j, the source line controllers 251–25j, the well controllers 271–27j, the read/write circuit 26 and the selector 28 to behave in a selected mode of operation.

The word lines WL1–WLn are connected to the word line selector 23. The word line selector 23 is responsive to a row address signal ADR so as to select one of the word lines WL1–WLn and, accordingly, one of the rows of memory cells M11–Mnm from each sector 221–22j. The row address signal ADR is produced from an external row address signal supplied from an external device such as a microprocessor. Potential level on the selected word line is dependent on the mode of operation, and will be described hereinlater.

The bit line groups BG1–BGj are respectively connected to the bit line selectors 241–24j. The bit line selector 241–24j are selectively enabled with a control signal CTL1 in the modes of operation except the multi-write mode, which is supplied from the selector 28. The control signal CTL1 is indicative of one of the sectors 221–22j to be enabled in the write-in mode, the read-out mode and the erasing mode. However, all of the signal bits of the control signal CTL1 are changed to the active high level in the multi-write mode.

The selector 28 selectively changes the signal bits of the control signal CTL1 to the high level in the modes of operation except the multi-write mode as described herienbefore. When the control signal CTL1 enables a bit line selector 241–24j, the bit line selector 241–24j becomes responsive to a column address signal ADC so that the bit line selector 241–24j selects one of the bit lines BL1–BLm from the associated bit line group BG1–BGj. The selected bit line is connected to the read/write circuit 26. The column address signal ADC is produced from an external column address signal, which is supplied from the external device.

On the other hand, all the signal bits of the control signal CTL1 are changed to the high level in the multi-write mode, and all the bit line selectors 241–24j become active. Each of the bit line selectors 241–24j selects eight bit lines, and the read/write circuit 26 supplies electric current through the bit line selectors 241–24j to (8×j) bit lines.

Figure 5:
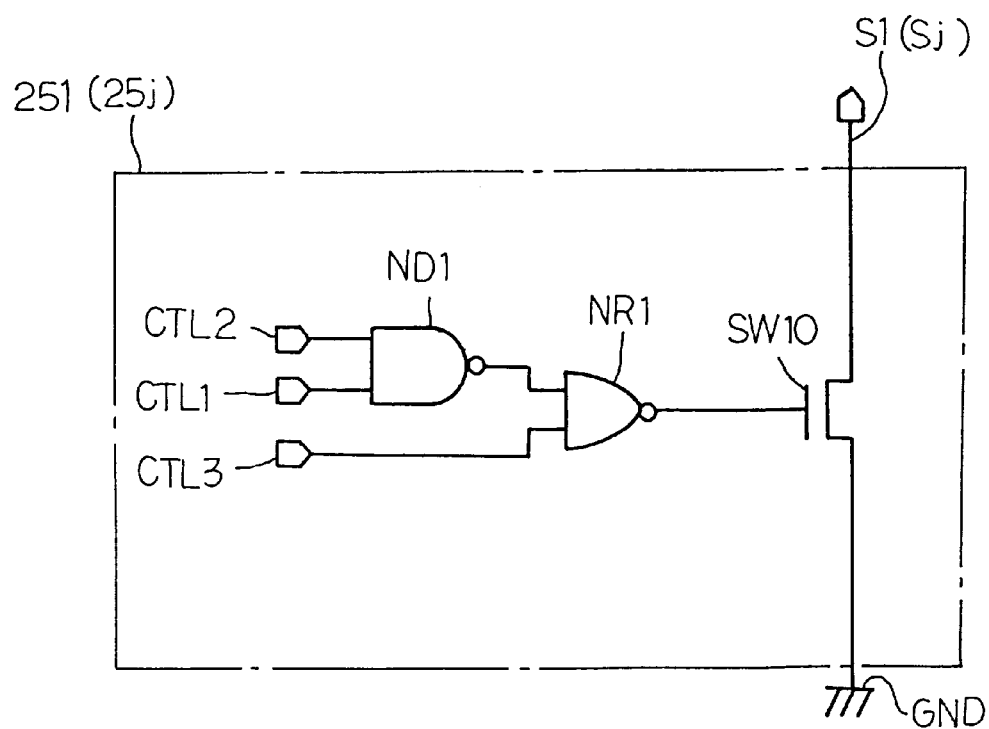
FIG. 5 is circuit diagram showing the circuit configuration of a source line controller incorporated in the semiconductor electrically erasable and programmable read only memory device.

The source line controllers 251–25j are similar in circuit configuration to one another, and each of the source line controller 251–25j includes an n-channel enhancement type switching transistor SW10, a NAND gate ND1 and a NOR gate NR1 (see FIG. 5). The n-channel enhancement type switching transistor SW10 is connected between the associated source line S1–Sj and a ground line GND as similar to those SW1/SW2/SW3/SW4 shown in FIG. 3. The control signal CTL1 and another control signal CTL2 are supplied to the input nodes of the NAND gate ND1, and the output signal of the NAND gate ND1 and yet another control signal CTL3 are supplied to the input nodes of the NOR gate NR1. The output node of the NOR gate NR1 is connected to the gate electrode of the n-channel enhancement type switching transistor SW10. The control signals CTL2/CTL3 are supplied from the controller 29.

The control signal CTL2 of the high level is representative of the write-in mode or the multi-write mode. When the control signal CTL2 is changed to the high level, the NAND gate ND1 becomes responsive to the control signals CTL1. On the other hand, the control signal CTL3 of the high level is representative of the erasing mode. While the electrically erasable and programmable read only memory device is in the write-in mode or the multi-write mode, controller 29 keeps the control signal CTL3 in the inactive low level, and the NOR gate NR 1 is enabled with the control signal CTL3 of the low level.

A sector address signal ADS is assumed to indicate one of the sectors 221–22j in the write-in mode. The control signals CTL2/CTL3 have been already changed to the high level and the low level, respectively, and the selector 28 changes the signal bit of the control signal CTL1 to the high level. Then, the NAND gate ND1 changes the output node thereof to the low level, and, accordingly, the NOR gate NR1 changes the output node thereof to the high level. As a result, the n-channel enhancement type switching transistor SW10 turns on, and the associated source line S1–Sj is connected to the ground line GND. If the electrically erasable and programmable read only memory device is in the multi-write mode, the control signals CTL2/CTL3 are in the high level and the low level, respectively, and all the signal bits of the control signal CTL1 are changed to the high level. As a result, the n-channel enhancement type switching transistors SW10 of all the source line controllers 251–25j concurrently turn on, and all the source lines S1–Sj are connected to the ground line GND.

When the electrically erasable and programmable read only memory device enters the erasing mode, the controller 29 changes the control signals CTL2/CTL3 to the low level and the high level, respectively. The control signal CTL3 of the high level forces the NOR gate NR1 to keep the output node thereof in the low level regardless of the other control signals CTL1/CTL2. Thus, the n-channel enhancement type switching transistors SW10 are turned off in the erasing mode, and the source lines S1–Sj are in the floating state.

The read/write circuit 26 is connectable through one of the bit line selectors 241–24j to a bit line selected from one of the bit line groups BG1–BGj in the write-in mode and the read-out mode. The read/write circuit 26 is connectable through all the bit line selectors 241–24j to (8×j) bit lines selected from the bit line groups BG1–BGj in the multi-write mode.

In order to read out a data bit from a selected memory cell, the read/write circuit 26 supplies electric current through one of the bit line selectors 241–24j to the select bit line BL1–BLm, and monitors the potential level on the selected bit line BL1–BLm. If the selected memory cell has the high threshold, the selected memory cell isolates the selected bit line BL1–BLm from the associated source line S1–Sj, and the selected bit line BL1–BLm keeps the potential level high. On the other hand, if the selected memory cell has the low threshold, the selected memory cell turns on, and allows the electric current to flow from the selected bit line BL1–BLm to the associated source line S1–Sj, and the potential level on the selected bit line BL1–BLm falls. The read/write circuit 26 determines the logic level of the read-out data bit, and produces an output data signal.

In the write-in mode, the read/write circuit 26 positively biases a bit line BL1–BLj selected from the bit line group BG1–BGj associated with a selected sector 221–22j. The electric current flows from the selected bit line BL1–BLm into the associated source line S1–Sj, and produces hot electron. The hot electron is injected into a selected memory cell M00–Mnm, and changes the threshold of the selected memory cell.

In the multi-write mode, the read/write circuit 26 is connected through all the bit line selectors 241–24j to bit lines BL1–BLm respectively selected from the bit line groups BG1–BGj, and biases the selected bit lines BL1–BLm. The electric current flows from the selected bit lines BL1–BLm into all the source lines S1–Sj, and produces hot electron. The hot electron is injected into selected memory cells M00–Mnm.

Figure 6:
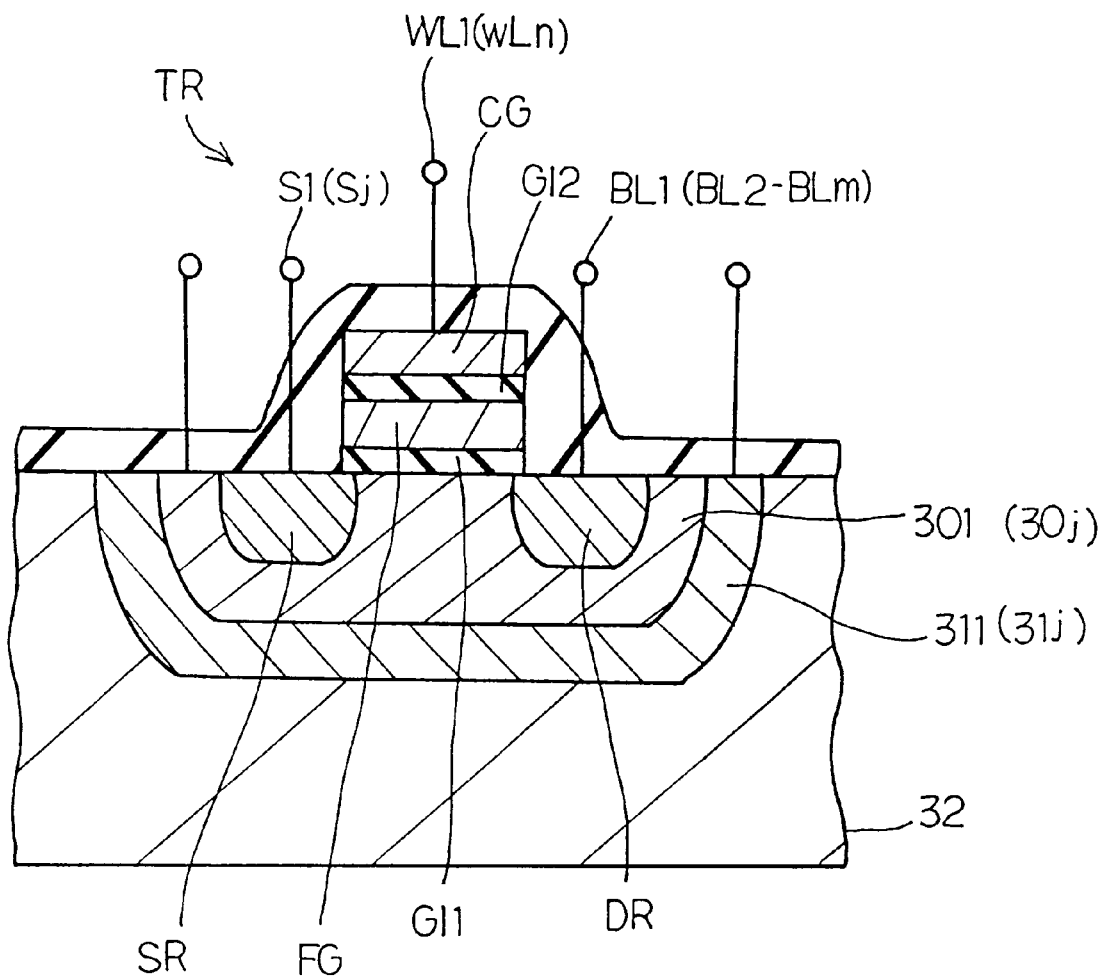
FIG. 6 is a cross sectional view showing the structure of a floating gate type field effect transistor serving as a memory cell of the semiconductor electrically erasable and programmable read only memory device.

P-type wells 301–30j are respectively assigned to the sectors 221–22j, and are respectively nested in n-type wells 311–31j. The n-type wells 311–31n are formed in surface portions of a p-type semiconductor substrate 32 (see FIG. 6). Although only one floating gate type field effect transistor TR is shown in FIG. 6, the plural floating gate type field effect transistors are similarly fabricated on the p-type well 301/ . . . /30j, and serve as the memory cells M11–Mnm. The floating gate type field effect transistor TR includes n-type source/drain regions SR/DR spaced from one another in the p-type well 301–30j, a gate insulating layer GI1 formed on the p-type well 301–30j between the source region SR and the drain region DR, a floating gate electrode FG formed on the gate insulating layer GI1, a gate insulating layer GI2 formed on the floating gate electrode FG and a control gate electrode CG formed on the gate insulating layer GI2.

The source region SR is connected to the associated source line S1–Sj, and the drain region DR is connected to the associated bit line BL1–BLm. The control gate electrode CG is connected to the associated word line WL1–WLn. The p-type wells 301–30j and the n-type wells 311–31j are respectively connected to the associated well controller 271–27j, and the well controllers 271–27j appropriately bias the p-n junctions between the n-type wells 311–31j and the p-type wells 301–30j.

The control gate electrode CG, the n-type drain region DR, the n-type source region SR, the p-type well 301–30j and the n-type well 311–31j are differently biased in the above-described modes of operation as shown in the following table.

TABLE

| Operation Mode | Control Gate | Drain | Source | P-well | N-well |
|---|---|---|---|---|---|
| Read-out | 5 volts | 1 volt | Ground | Ground | Ground |
| Write-in | 12 volts | 5 volts | Ground | Ground | Ground |
| Erasing | –10 volts | Floating | Floating | 10 volts | 10 volts |

The read/write circuit 26 biases a selected bit line to the 5 volts in the write-in mode, and the hot electron is produced around the n-type drain region DR. The hot electron is attracted toward the floating gate electrode FG due to the electric field created by the control gate electrode CG. The electron is accumulated in the floating gate electrode FG, and the floating gate type field effect transistor TR or the memory cell changes the threshold to the high level. In order to change the threshold to the high level, 400 micro-ampere is consumed in each memory cell.

On the other hand, the control gate electrode CG is biased to –10 volts, and both of the p-type well 301–30j and the n-type well 311–31j are biased to 10 volts. Then, the accumulated electron is evacuated from the floating gate electrodes as Fowler-Nordheim tunneling current, and the Fowler-Nordheim tunneling current is equal to or less than 1 micro-ampere per sector 221–22j. A potential barrier is created between the n-type well 311–31j and the p-type substrate 32, and the Fowler-Nordheim tunneling current does not flow into the p-type substrate 32.

Figure 7:
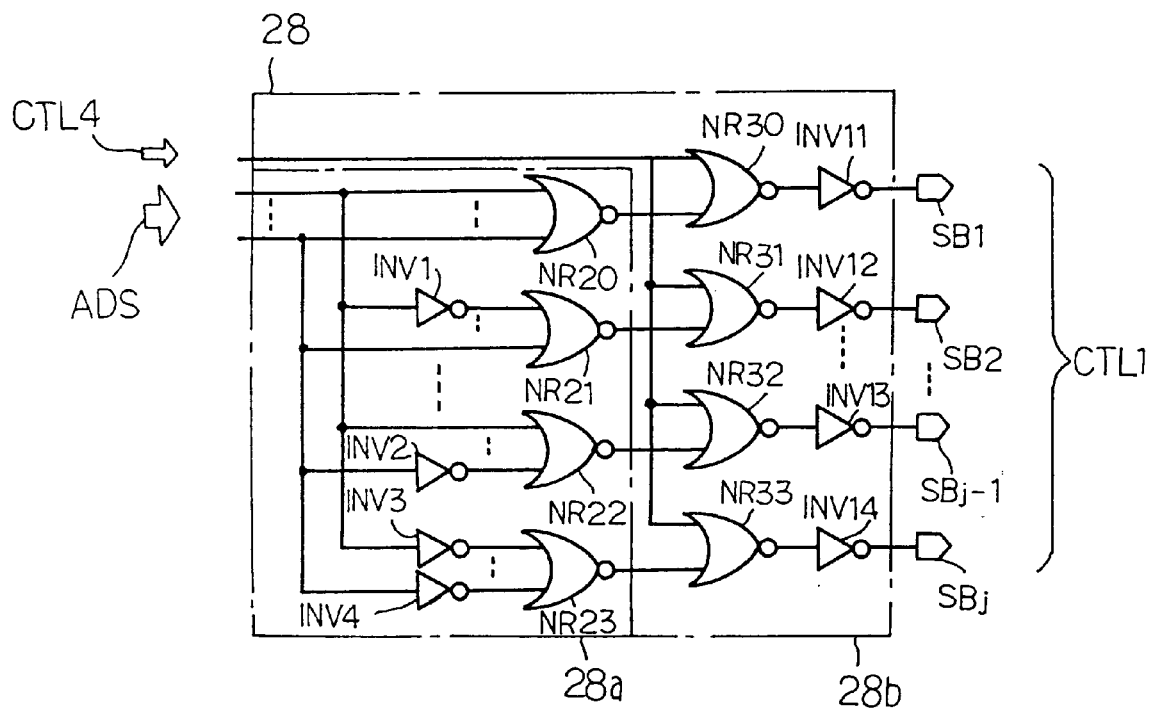
FIG. 7 is a circuit diagram showing the circuit configuration of a selector incorporated in the semiconductor electrically erasable and programmable read only memory device.

The selector 28 differently behaves between the multi-write mode and the other modes of operation. FIG. 7 illustrates the circuit configuration of the selector 28. The selector 28 is broken down into a decoder 28a and a signal generator 28b. The selector address signal ADS is supplied to the decoder 28a, and is decoded. The decoded signals are supplied to the signal generator 28b and a control signal CTL4 representative of the multi-write mode are supplied to the signal generator 28b. When the control signal CTL4 is in the low level, the signal generator 28b selectively changes the signal bits SB1/SB2/ . . . / SBj–1/SBj of the control signal CTL1 to the active level on the basis of the decoded signals. On the other hand, when the control signal CTL4 is in the high level, the signal generator 28b changes all the signal bits SB1/SB2/ . . . /SBj–1/SBj to the high level regardless of the decoded signals.

The decoder 28a includes inverters INV1/INV2/ . . . /INV3/INV4 and NOR gates NR20/NR21/ . . . /NR22/NR23. The inverters INV1–INV4 produce inverted signal bits from the signal bits of the sector address signal ADS. The inverted signals are selectively combined with the signal bits, and the combinations are selectively supplied to the NOR gates NR20–NR23, respectively. Only one of the combinations makes the NOR gate NR20–NR23 to produce the output signal of logic "1" level.

The signal generator 28b includes NOR gates NR30/NR31/ . . . /NR32/NR33 and inverters INV11/INV12/ . . . /INV13/INV14 respectively connected to the output nodes of the NOR gates NR30–NR33. The control signal CTL4 is supplied to all the NOR gates NR30–NR33, and the output signals are respectively supplied from the output nodes of the NOR gates NR20–NR23 to the input nodes of the NOR gates NR30–NR33. When the electrically erasable and programmable read only memory device enters the multi-write mode, the control signal CTL4 is changed to the high level, and all the NOR gates NR30–NR33 produce the output signals of the low level. As a result, the inverters INV11–INV14 change all the signal bits SB1/SB2/ . . . SBj–1/SBj to the high level.

As described hereinbefore, the signal bits SB1–SBj are respectively supplied to the NAND gates ND1 of the source line controllers 251–25j, and make the NAND gates ND enable. For this reason, when the control signal CTL2 is changed to the high level in the multi-write mode, the NOR gates NR1 supply the high level to the n-channel enhancement type switching transistors SW10 of all the source line controllers 251–25j, and all the source lines S1–Sj are connected through the n-channel enhancement type switching transistors SW10 to the ground one GND. The control signal CTL1 is also supplied to the bit line selectors 241–24j, and causes all the bit line selectors 241"24j to select (8×j) bit lines. Thus, the selector 28 cause the bit line selectors 241–24j and the source line controllers 251–25j to provide the current paths from the read/write circuit 26 through the source lines S1–Sj to the ground line GND.

On the other hand, if the control signal CTL4 is in the low level, the NOR gates NR30–NR33 are responsive to the output signals of the NOR gates NR20–NR23, and only one of the NOR gates NR30–NR33 changes the output signal to the low level. As a result, only one of the signal bits SB1–SBj is changed to the high level in the other modes of operation.

The controller 29 is communicable with the external device such as a microprocessor, and the external address signals and external control signals such as a mode instruction signal are supplied from the external device to the controller 29. The controller 29 produces the row address signal ADR, the column address signal ADC and the sector address signal ADS from the external address signals, and supplies the row address signal ADR, the column address signal ADC and the sector address signal ADS to the word line selector 23, the bit line selectors 241–24j and the selector 28.

The controller 29 further produces the control signal CTL2 representative of the write-in mode and the multi-write mode, the control signal CTL3 representative of the erasing mode and the control signal CTL4 representative of the multi-write mode from the external control signals. The controller selectively supplies the control signals CTL2/CTL3/CTL4 to the row address decoder 23, the bit line selectors 241–24j, the source line controllers 251–25j, the well controllers 271–27j and the selector 28.

Figure 8:
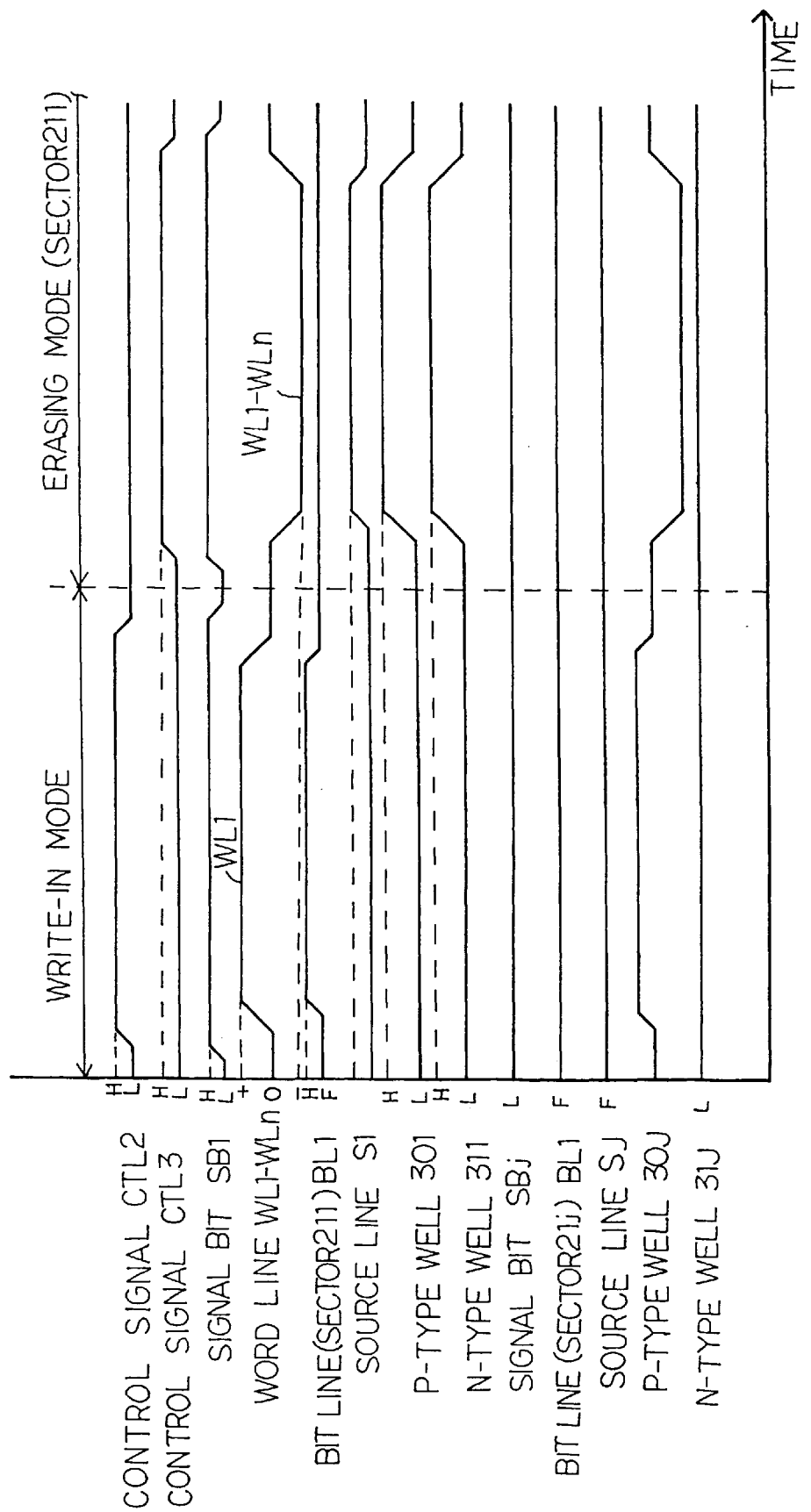
FIG. 8 is a timing chart showing the circuit behavior of the semiconductor electrically erasable and programmable read only memory device in a write-in mode and an erasing mode.

Description is hereinbelow made on the circuit behaviors of the electrically erasable and programmable read only memory device. FIG. 8 illustrates the circuit behavior in the write-in mode and the erasing mode.

Assuming now that the external control signals request the electrically erasable and programmable read only memory device to enter the write-in mode, the controller 29 keeps the control signals CTL3/CTL4 in the low level, and changes the control signal CTL2 to the high level. The selector 28 becomes responsive to the sector address signal ADS, and the control signal CTL2 makes the word line selector 23 connected to a positive potential source (not shown).

If the external address signals are indicative of the memory cell M11 of the sector 221, the selector 28 changes the signal bit SB1 to the high level, the word line selector 23 changes the word line WL1 to +12 volts, and the bit line selector 241 connects the bit line BL1 to the read/write circuit 26. The read/write circuit 26 applies +5 volts to the bit line BL1 of the bit line group BG1. The selector 28 keeps the other signal bits SB2–SBj in the low level, and the other bit line selectors such as 24j isolate the associated bit line groups from the read/write circuit 26.

The signal bit SB1 is further supplied to the source line controller 251 and the well controller 271. The n-channel enhancement type switching transistor SW10 of the source line controller 251 turns on, and the source line S1 is connected to the ground line GND. However, the other source line controllers such as 25j isolates the associated source lines Sj from the ground line GND. The well controller 271 keeps the p-type well 301 and the n-type well 311 at the ground level GND. The other well controllers such as 27j build a potential barrier between the associated p-type wells 30j and the associated n-type wells 31j.

Thus, the word line WL1, the bit line BL1, the source line S1, the p-type well 301 and the n-type well 311 are biased as shown in above-described table, and electric current flows through the memory cell M11 of the sector 221. The electric current generates the hot electron, and the hot electron is injected into the floating gate electrode FG of the memory cell M11.

When the external control signal requests the electrically erasable and programmable read only memory device to enter the erasing mode, the controller 29 firstly changes the control signals CTL2/CTL4 to the high level. The selector 28 changes all the signal bits SB1–SB4 to the high level, and the n-channel enhancement type switching transistors SW10 of all the source line controllers 251–25j turns on so as to connect the associated source lines S1–Sj to the ground line GND. The well controllers 271–27j supply the ground level to the p-type wells 301–30j and the n-type wells 311–31j.

The signal bits SB1–SBj make each of the bit line selectors 214–24j select eight bit lines from the associated bit line group BG1–BGj. As a result, the read/write circuit 26 applies 5 volts (8×j) bit lines. The word line selector 23 supplies 12 volts to a selected word line. The electric current flows from the (8×j) bit lines through (8×j) memory cells into the source lines S1–Sj, and is discharged through the n-channel enhancement type switching transistors SW10 to the ground line GND. The total amount of electric current flowing into each source line S1–Sj is eight times more than that of the write-in mode, and is 3.2 milli-amperes. However, one of the word lines Wl1–WLn is connected to m memory cells of each sector 221–22j, and m is greater than eight. If m is corresponding to 4 types, i.e., 32 memory cells, the total amount of electric current is reduced to a quarter.

The bit line selectors 241–24j and the word line selector 23 sequentially change the eight bit lines and the selected word line, and the electrically erasable and programmable read only memory device repeats the above-described multi-write on the selected eight memory cells. Finally, all the memory cells M11–Mnm of memory cell array 22 are changed to the write-in state.

Upon completion of the multi-write on the memory cell array 22, the controller 29 changes the control signal CTL3 to the high level. The control signal CTL3 causes the NOR gates NR1 of all the source line controllers 251–25j to change the output nodes thereof to the low level. This results in that all the n-channel enhancement type switching transistors SW10 turns off, and the source lines S1–Sj enter into the floating state F.

The controller 29 firstly supplies the sector address signal ADS indicative of the sector 221 to the selector 28. The selector changes the signal bit SB1 to the high level, and keeps the other signal bits SB2–SBj in the low level. The bit line selectors 241–24j isolate the bit lines BL1–BLm from the read/write circuit 26, and all the bit lines BL1–BLm enter the floating state F.

The well controller 271 applies 10 volts to the p-type well 301 and the n-type well 311. The other well controllers such as 27j applies a negative potential and the ground level to the p-type wells 30j and the n-type wells 31j, and the p-n junctions therebetween are reversely biased. The potential barrier presents the other sectors such as 22j from the data erasing.

The control signal CTL3 causes the word line selector 23 to change all the word lines WL1 to WLn to −10 volts. Then, the Fowler-Nordheim tunneling current flows from the floating gates FG of the memory cells M11–Mnm of the sector 221 to the p-type well 301, and the accumulated electron is evacuated from the floating gates FG. Thus, the memory cells M11–Mnm of the sector 221 concurrently enter the erased state.

If the other sectors are to be erased, the selector 28 changes another signal bit to the high level, and the electrically erasable and programmable read only memory device sequentially repeats the above-described erasing operation on the other sectors.

In the first embodiment, the read/write circuit 26 and the selector 28 serve as a data write-in circuit and a first addressing circuit, respectively. The bit line selectors 241–24j, the bit line groups BG1–BGj, the word line selector 23 and the word lines WL1–WLn as a whole constitute a second addressing circuit. The controller 29 and the selector 28 form in combination a controlling circuit.

As will be understood from the foregoing description, the electrically erasable and programmable read only memory device carries out the multi-write on plural memory cells selected from the sectors 221–22j. The electric current is distributed to the n-channel enhancement type switching transistors SW10, and the electric current does not float up the potential level on the source lines S1–Sj without enlargement of the n-channel enhancement type switching transistors SW10. Thus, the source lines S1–Sj are maintained around the ground level, and the hot electron is effectively injected into the floating gates FG of the selected memory cells.

Second Embodiment

Figure 9:
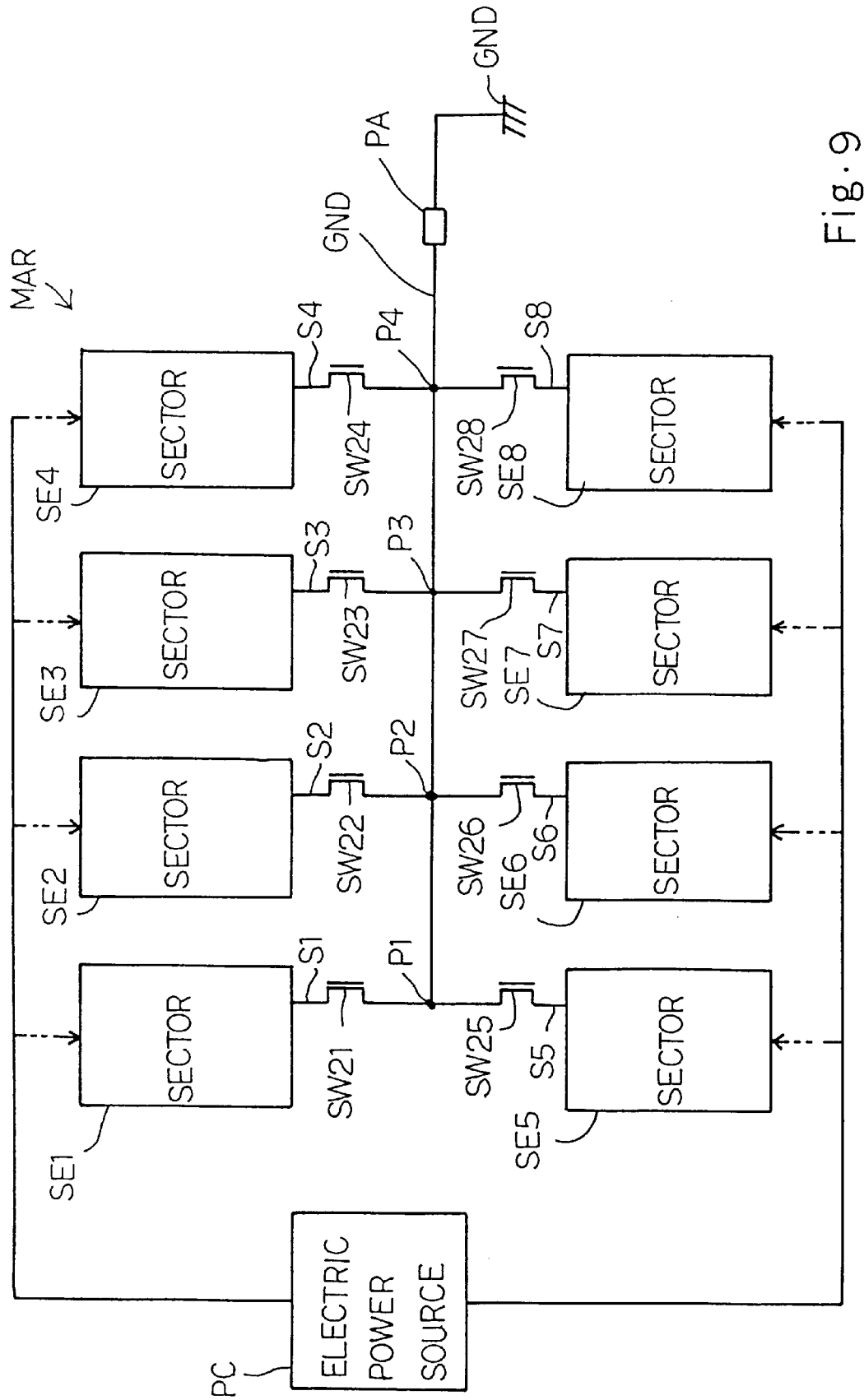
FIG. 9 is a block diagram showing the arrangement of another semiconductor electrically erasable and programmable read only memory device according to the present invention.

Turning to FIG. 9 of the drawings, another electrically erasable and programmable read only memory device embodying the present invention has a memory cell array MAR divided into eight sectors SE1/SE2/SE3/SE4/SE5/SE6/SE7/SE8. Each of the sectors SE1–SE8 is similar in arrangement to the sector 21–22j. A ground line GND is connected through a ground pad PA to the ground. N-channel enhancement type switching transistors SW21/SW22/SW23/SW24/SW25/SW26/SW27/SW28 are connected between the sectors SE1–SE8 and the ground line GND, and an electric power source PC is selectively or concurrently connected to the sectors SE1–SE8.

Though not shown in FIG. 9, the sectors SE1–SE8 are connected to respective bit line selectors, respective source line controllers and respective well controllers, and the controller, the selector and the word line selector are also incorporated in the electrically erasable and programmable read only memory device. The electric power source PC forms a part of a read/write circuit corresponding to the read/write circuit 26, and the n-channel enhancement type switching transistors SW21–SW28 are incorporated in the source line controllers, respectively.

When electric current flows from the electric power source PC through the sectors SE1–SE8 into the ground line GND, potential difference takes place between the nodes P1/P2/P3/P4 on the ground line GND. The farther from the ground pad PA, the larger the potential difference with respect to the ground level. The potential difference is transferred from the nodes P1–P4 to the source lines S1–S8, and makes the electron injection efficiency different.

In this instance, four sectors are concurrently selected from the memory cell array MAR in the multi-write mode. The electrically erasable and programmable read only memory device selects the sectors SE1–SE4 or SE5–SE8, because any part of the ground line GND is prevented from concentration of electric current. This results in equalization of the electron injection efficiency between the selected sectors.

The electrically erasable and programmable read only memory device implementing the second embodiment achieves all the advantages of the first embodiment.

Although particular embodiments of the present invention have been shown and described, it will be apparent to those skilled in the art that various changes and modifications may be made without departing from the spirit and scope of the present invention.

For example, the word lines WL1–WLn may not be shared between all the sectors. The n-channel enhancement type switching transistors SW10 may selectively turn on in the multi-write operation. Otherwise, the bit line selectors 241–24j may be selectively enabled after all the n-channel enhancement type switching transistors SW10 turn on. Only one bit line may be selected from each bit line group in the multi-write mode.

What is claimed is:

1. A semiconductor non-volatile memory device comprising:
  a memory cell array divided into plural sectors each having plural addressable memory cells respectively storing data bits in the form of accumulated carrier changing said plural memory cells between different threshold levels;
  a data write-in circuit for producing a write-in potential used for increasing said accumulated carrier;
  a first addressing circuit selecting sectors from said memory cell array during a multi-write operation for propagating said write-in potential to said sectors;
  a second addressing circuit selecting at least one memory cell from each of said sectors selected by said first addressing circuit for propagating said write-in potential to the memory cells selected from said sectors during the multi-write operation;
  a source line controllers respectively associated with said plural sectors and having respective switching elements connected between the plural addressable memory cells of the associated plural sectors and a discharging line; and
  a controlling circuit causing the switching elements associated with said sectors selected by said first addressing circuit to turn on in said multi-write operation for discharging electric current from said memory cells to said discharging line.

2. The semiconductor non-volatile memory device as set forth in claim 1, in which said plural memory cells comprise floating gate type field effect transistors.

3. The semiconductor non-volatile memory device as set forth in claim 1, in which said first addressing circuit selects one of said plural sectors in a standard write-in operation, a read-out operation and an erasing operation, and said write-in potential is propagated to one of said plural memory cells of said one of said plural sectors for increasing and accumulated carrier in said standard write-in operation.

4. The semiconductor non-volatile memory device as set forth in claim 3, further comprising an erasing circuit evacuating said accumulated carrier from said plural memory cells of said one of said plural sectors in said erasing operation.

5. The semiconductor non-volatile memory device as set forth in claim 4, further comprising a read-out circuit.

6. The semiconductor non-volatile memory device as set forth in claim 1, in which said second addressing means selects more than one memory cell from each of said sectors selected by said first addressing circuit for propagating said write-in potential to the memory cells selected from said sectors in said multi-write operation.

7. The semiconductor non-volatile memory device as set forth in claim 6, in which said first addressing circuit selects one of said plural sectors in a standard write-in operation, a read-out operation and an erasing operation, and said write-in potential is propagated to one of said plural memory cells of said one of said plural sectors for increasing said accumulated carrier in said standard write-in operation.

8. The semiconductor non-volatile memory device as set forth in claim 7, further comprising an erasing circuit evacuating said accumulated carrier from said plural memory cells of said one of said plural sectors in said erasing operation.

9. The semiconductor non-volatile memory device as set forth in claim 8, further comprising a read-out circuit.

10. The semiconductor non-volatile memory device as set forth in claim 1, in which said discharging line has plural nodes of differently spaced from a conductive pad assigned a constant voltage, and said plural sectors are selectively connected through said switching elements to said plural nodes so that said plural sectors form plural sector groups respectively connected to said plural nodes, wherein said controlling circuit selects each of said selecting elements associated with said sectors selected by said first addressing circuit from one of said plural sector groups.

11. A method for controlling a multi-write operation, comprising the steps of:
  a) selecting memory cells from each of plural sectors that are selected from a memory cell array during a multi-write operation in a non-volatile memory device;
  b) creating current paths from a source of write-in potential through the selected memory cells and switching transistors respectively connected to the selected sectors to a discharging line during the multi-write operation; and c) applying a write-in potential through said current paths to the selected memory cells so that the selected memory cells change respective thresholds due to carriers injected thereinto.

12. The method as set forth in claim 11, in which more than one memory cell is selected from each of said sectors in said step a).

13. The method as set forth in claim 12, in which said more than one memory cell stores a byte of data.

14. The method as set forth in claim 11, in which an erasing operation is carried out for at least one of said sectors after said step c).

15. A semiconductor non-volatile memory device comprising:

a memory cell array divided into plural sectors, each of said sectors comprising a well in a substrate that is separate from the wells of adjacent said sectors, each said well comprising plural memory cells that are each connected to one of plural bit lines and one of plural word lines and that each store a data bit in the form of an accumulated carrier that defines a threshold level of the memory cell, each of said plural word lines being connected to plural said memory cells in each of said sectors and each of said plural bit lines being connected to plural said memory cells in a single one of said sectors;

a data write-in circuit providing a write-in potential that increases the accumulated carrier;

a first addressing circuit selecting said sectors in a multi-write operation and propagating the write-in potential to the selected sectors;

a second addressing circuit selecting at least one memory cell from each of said sectors selected by said first addressing circuit and propagating the write-in potential to the at least one selected memory cell, said second addressing circuit comprising plural bit line selectors that each select at least one of said bit lines in a different one of said selected sectors that is connected to the at least one selected memory cell and a word line selector that selects one of said word lines that is connected to the at least one selected memory cell in each of the selected sectors;

plural source line controllers, one for each of said sectors, that each comprise a switching element selectively connecting said memory cells in the respective said sector to a discharge line; and a controlling circuit turning on said switching element in each of the selected sectors during the multi-write operation, thereby discharging current from the at least one selected memory cell to said discharge line.

16. The device of claim 15, wherein said second addressing circuit selects eight of said memory cells from each of the selected sectors, said eight memory cells all being connected to the same one of said word lines and eight different ones of said bit lines, and wherein there are more than eight of said bit lines.

17. A method of controlling a multi-write operation in a semiconductor non-volatile memory device that includes a memory cell array divided into plural sectors, each of the sectors having a well in a substrate that is separate from the wells of adjacent sectors, each well having plural memory cells that are each connected to one of plural bit lines and one of plural word lines and that each store a data bit in the form of an accumulated carrier that defines a threshold level of the memory cell, each of the plural word lines being connected to plural memory cells in each of the sectors and each of the plural bit lines being connected to plural memory cells in a single one of the sectors, and a data write-in circuit providing a write-in potential that increases the accumulated carrier, the method comprising the steps of:

selecting the sectors in a multi-write operation and propagating the write-in potential to the selected sectors;

selecting at least one memory cell from each of the selected sectors and propagating the write-in potential to the at least one selected memory cell by selecting at least one of the bit lines in each of the selected sectors that is connected to the at least one selected memory cell and selecting the one of the word lines that is connected to the at least one selected memory cell in each of the selected sectors;

selectively connecting the memory cells in each of the sectors to a discharging line with one of a plurality of switching elements that are separately provided for each of the sectors; and turning on the switching element in each of the selected sectors during the multi-write operation, thereby discharging current from the at least one selected memory cell to the discharge line.

18. The method of claim 17, wherein eight of the memory cells are selected from each of the selected sectors, the eight memory cells all being connected to the same one of the word lines and eight different ones of the bit lines.

19. The method of claim 17, wherein more than one of the memory cells are selected from each of the selected sectors, the more than one memory cells all being connected to the same one of the word lines and different ones of the bit lines.

* * * * *